United States Patent
Hamada et al.

(10) Patent No.: US 11,942,913 B2
(45) Date of Patent: Mar. 26, 2024

(54) VARIABLE GAIN AMPLIFIER

(71) Applicant: Nippon Telegraph and Telephone Corporation, Tokyo (JP)

(72) Inventors: Hiroshi Hamada, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 841 days.

(21) Appl. No.: 16/978,541

(22) PCT Filed: Feb. 27, 2019

(86) PCT No.: PCT/JP2019/007512
§ 371 (c)(1),
(2) Date: Sep. 4, 2020

(87) PCT Pub. No.: WO2019/187924
PCT Pub. Date: Oct. 3, 2019

(65) Prior Publication Data
US 2021/0021248 A1    Jan. 21, 2021

(30) Foreign Application Priority Data

Mar. 30, 2018  (JP) ................................ 2018-067532

(51) Int. Cl.
*H03F 3/24* (2006.01)
*H01P 5/18* (2006.01)
(Continued)

(52) U.S. Cl.
CPC ............ *H03G 3/3042* (2013.01); *H01P 5/18* (2013.01); *H03D 1/10* (2013.01); *H03F 3/24* (2013.01); *H04B 1/04* (2013.01)

(58) Field of Classification Search
CPC ... H03G 3/3042; H03F 3/24; H03F 2200/105; H03F 3/601; H03F 3/604; H03F 2200/451; H01P 5/18; H03D 1/10; H04B 1/04
(Continued)

(56) References Cited

U.S. PATENT DOCUMENTS 5,177,453 A    1/1993  Russell et al.
5,367,268 A    11/1994 Baba
(Continued)

FOREIGN PATENT DOCUMENTS

JP    S63187820       8/1988
JP    H04269006 A     9/1992
(Continued)

OTHER PUBLICATIONS

Li, Shuo, et al., "A Low Power CMOS Amplitude Peak Detector for On-Chip Self-Calibration Applications," 2017 IEEE National Aerospaceand Electronics Conference, Jun. 27, 2017, pp. 323-326.
(Continued)

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

A gain adjustment unit constituted by a distribution switch having a control terminal is provided in an input unit of an amplifier circuit. One end of a coupler is connected to an output line of the amplifier circuit, another end of the coupler is connected to an anode of a diode, and a monitor terminal is connected via a low-pass filter to a cathode of the diode. The anode of the diode is unbiased.

19 Claims, 16 Drawing Sheets

(51) Int. Cl.
*H03D 1/10* (2006.01)
*H03G 3/30* (2006.01)
*H04B 1/04* (2006.01)

(58) Field of Classification Search
USPC .......................................................... 330/278
See application file for complete search history.

(56) References Cited

U.S. PATENT DOCUMENTS

2008/0231368 A1* 9/2008 Suzaki .................... H03F 3/19
                                                                        330/277
2010/0201448 A1    8/2010 Sasaki

FOREIGN PATENT DOCUMENTS

| JP | H05243852 A | 9/1993 |
| JP | H06177780 | 6/1994 |
| JP | 201546741 | 3/2015 |
| JP | 2017073632 A | 4/2017 |
| JP | 2010183453 | 8/2020 |

OTHER PUBLICATIONS

Mizutani, H., et al., "A DC-60 GHz GaAs MMIC Switch Using Novel Distributed FET," Microwave Symposium Digest, Jun. 8, 1997, pp. 439-442.

Rahmatian, B., et al., "A Low-Power 75dB Digitally Programmable CMOS variable-Gain Amplifier," Department of Electrical and Computer Engineering University of British Columbia, Apr. 22, 2007, pp. 522-525.

Wang, Yongsheng, et al., "A Low Gain Error Two-Stage dB-Linear Variable Gainamplifier in 0.35μ m CMOS Process," 2017 IEEE 12th International Conference on ASIC, Oct. 25, 2017, pp. 367-370.

* cited by examiner

VARIABLE GAIN AMPLIFIER

CROSS-REFERENCE TO RELATED APPLICATIONS

This application is a national phase entry of PCT Application No. PCT/JP2019/007512, filed on Feb. 27, 2019, which claims priority to Japanese Application No. 2018-067532, filed on Mar. 30, 2018, which applications are hereby incorporated herein by reference.

TECHNICAL FIELD

The present invention relates to circuit technology for handling high-frequency electric signals and, in particular, to a variable gain amplifier capable of adjusting its gain.

BACKGROUND

As its name suggests, a variable gain amplifier is an amplifier of which gain is adjustable using an external adjustment terminal and is used in various applications including securing linearity of a high-frequency radio receiver and keeping transmitting power of a high-frequency radio transmitter constant (for example, refer to NPL 1).

FIG. 14 shows a basic configuration of a variable gain amplifier. The variable gain amplifier includes an amplifier 2 having a gain adjustment unit 1 for adjusting gain and a power monitor unit 3 provided in a subsequent stage of the amplifier 2.

The power monitor unit 3 includes a monitor terminal PM, the gain adjustment unit 1 includes a gain adjustment terminal PG, and output power of the amplifier 2 can be adjusted to a desired value by feeding back output power information of the amplifier 2 as obtained by the monitor terminal PM to the gain adjustment terminal PG.

For example, when imparting a gain varying function to a power amplifier, output power of the amplifier (power amplifier) 2 can be kept constant by feeding back output power obtained by the monitor terminal PM to the gain adjustment terminal PG and adjusting the gain of the amplifier (power amplifier) 2.

CITATION LIST

Patent Literature

[PTL 1] Japanese Patent Application Laid-open No. 2015-46741

[Non Patent Literature]

[NPL 1] Rahmatian, B., & Mirabbasi, S. (2007, April). A low-power 75 dB digitally programmable CMOS variable-gain amplifier. In Electrical and Computer Engineering, 2007. CCECE 2007. Canadian Conference on (pp. 522-525). IEEE.

[NPL 2] Yongsheng Wang, et al, "A low gain error two-stage dB-linear variable gain amplifier in 0.35 μm CMOS process", 2017 IEEE 12th International Conference on ASIC

[NPL 3] Shuo Li, et al, "A low power CMOS amplitude peak detector for on-chip self-calibration applications", 2017 IEEE National Aerospace and Electronics Conference

[NPL 4] H. Mizutani, et al, "A DC-60 GHz GaAs MMIC switch using novel distributed FET", Microwave Symposium Digest, 1997., IEEE MTT-S International

SUMMARY

Technical Problem

However, in conventional variable gain amplifiers, an amplifier circuit is also used in a gain adjustment unit and, therefore, a certain amount of power consumption is generated in the gain adjustment unit as described in NPL 1 and NPL 2. In addition, since an active circuit is often also used in the power monitor unit, power consumption also occurs in the power monitor unit. The power consumption by the gain adjustment unit and the power monitor unit become a problem when imparting a gain varying function to a power amplifier. Hereinafter, this problem will be described.

A power amplifier used in radio communication has high power consumption in order to obtain high output characteristics. Generally, power consumption and output are proportional to each other. This is because, since the higher the power consumption, larger voltage/larger current can be applied to a transistor constituting the power amplifier, high-frequency power to be output from the transistor can be increased. Since a proportion of power consumption by the power amplifier to power consumption of an entire radio communication device is large, generally, a radio equipment designer determines the power consumption by the power amplifier to be a certain constant value or lower as specifications of the power amplifier in order to prevent the power consumption by the entire radio device from increasing excessively.

When imparting a gain varying function that involves power consumption to a power amplifier as described earlier, since power consumption of the entire power amplifier is fixed, power consumption by a power amplifier core unit must be reduced by exercising ingenuities such as reducing a voltage/current value to be applied to each individual transistor constituting the power amplifier and/or reducing the number of transistors arranged in parallel in a power amplifier output stage. Each of such ingenuities works toward reducing output power of the power amplifier. In other words, imparting a gain varying function to the power amplifier inevitably requires reducing output power of the power amplifier.

The present invention has been made in order to solve such problems and an object thereof is to provide a variable gain amplifier capable of imparting a gain varying function to a power amplifier without reducing output power of the power amplifier.

Means for Solving the Problem

In order to achieve the object described above, embodiments of the present invention include: a gain adjustment unit (102) constituted by a switch (6) having a control terminal (PC) provided in an input unit of an amplifier circuit (101); and a power monitor unit (103) provided branched in an output unit of the amplifier circuit, wherein the power monitor unit includes: a coupler (CP) of which one end is connected to an output line of the amplifier circuit; a diode (D1) of which an anode is connected to another end of the coupler; and a monitor terminal (PM) connected to a cathode of the diode via a low-pass filter (PLF1), and the anode of diode is unbiased.

In embodiments of the present invention, the gain adjustment unit is constituted by a switch having a control terminal. In other words, the gain adjustment unit is constituted by a switch without power consumption. In addition, in the present invention, the anode of the diode constituting the power monitor unit is unbiased (set to ground potential=0 volts). Accordingly, power consumption can be reduced to almost zero in both the gain adjustment unit and the power monitor unit.

In the description given above, as an example, components shown in the drawings which correspond to components of embodiments of the invention are denoted by bracketed reference signs.

Effects of Embodiments of the Invention

As described above, according to the present invention, since a gain adjustment unit constituted by a switch having a control terminal is provided in an input unit of an amplifier circuit and an anode of a diode constituting a power monitor unit is unbiased, power consumption can be reduced to almost zero in both the gain adjustment unit and the power monitor unit, and a gain varying function can be imparted to a power amplifier without reducing output power of the power amplifier.

DETAILED DESCRIPTION OF ILLUSTRATIVE EMBODIMENTS

Hereinafter, embodiments of the present invention will be described in detail with reference to the drawings. First, before the description of the embodiments, a principle of embodiments of the present invention will be described.

Principle of Embodiments of the Invention

In embodiments of the present invention, in consideration of the problem described above, a gain adjustment unit and a power monitor unit capable of reducing power consumption to almost zero will be proposed and means constituting a high-output variable gain amplifier by combining the gain adjustment unit and the power monitor unit with a power amplifier will be provided.

Figure 15:
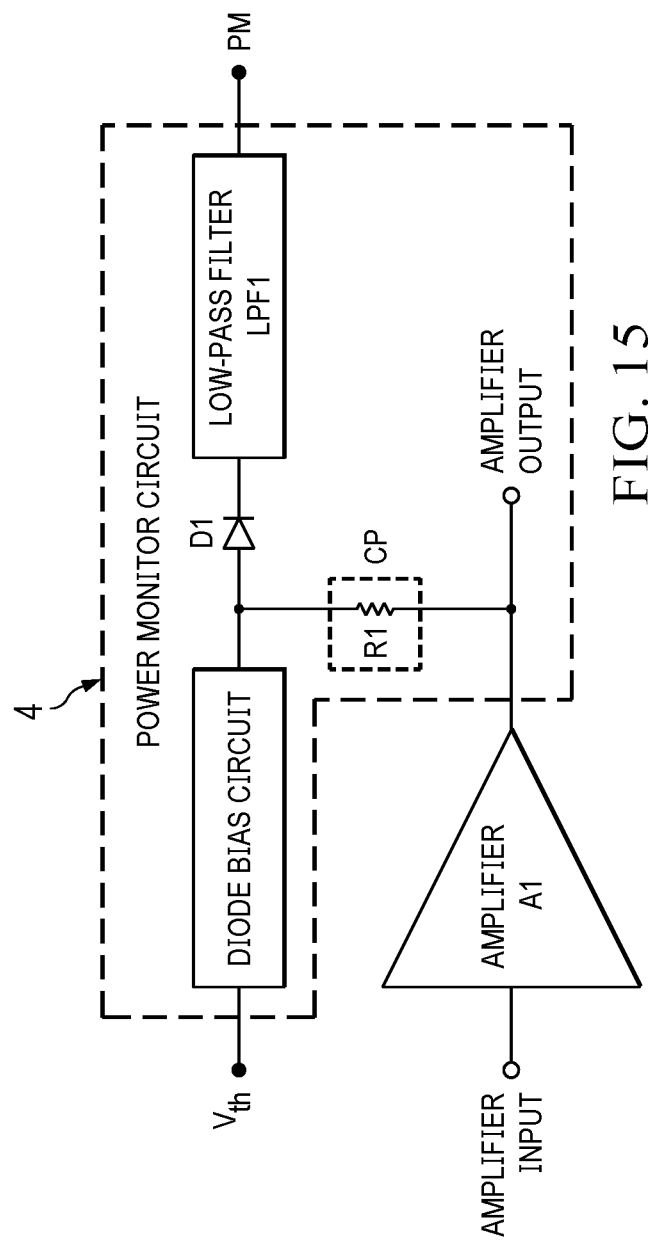
FIG. 15 is a diagram showing an outline of a conventional power monitor circuit.

First, power consumption by the power monitor unit will be described. Conventionally, there is a power monitor circuit using a diode circuit. FIG. 15 shows an outline of a conventional power monitor circuit 4.

The power monitor circuit 4 is configured such that, by connecting one end of a coupler CP (in the present example, a high resistance R1) to an output line of an amplifier A1 which is a monitoring target and connecting another end of the coupler CP to an anode of a diode D1, a part of output of the amplifier A1 is taken out by the coupler CP and input to the diode D1.

Figure 16:
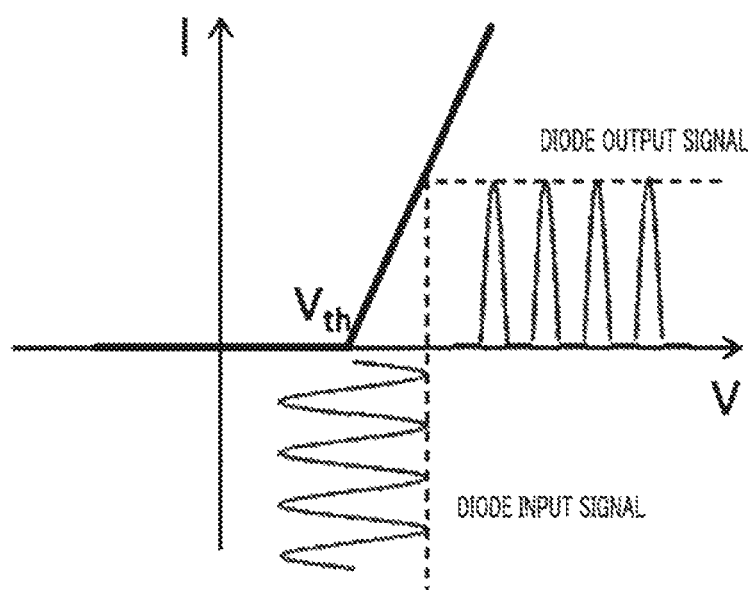
FIG. 16 is a diagram showing a diode input signal and a diode output signal in a conventional power monitor circuit together with characteristics of a diode

Since the diode D1 has characteristics indicated by a solid line in FIG. 16, by biasing the anode of the diode D1 to threshold voltage (Vth), a half-wave rectified waveform indicated as a diode output signal in FIG. 16 appears at a cathode of the diode D1.

An amplitude of the half-wave rectified waveform is proportional to power taken out by the coupler CP or, in other words, proportional to output of the amplifier A1 and, consequently, monitoring of the output of the amplifier A1 is realized. In order to obtain DC voltage (or a DC current) proportional to an amplitude of the diode output signal as monitor information from a monitor terminal PM, a cathode of the diode D1 is provided with a low-pass filter LPF1.

With this method, since the anode of the diode D1 must be constantly biased to Vth and a currently flows through the diode D1 upon diode detection, power consumption in the power monitor circuit 4 occurs. When the power monitor circuit 4 is applied as a power monitor unit to an amplifier circuit with large output power such as a power amplifier, since a detected current also increases, even larger power consumption occurs.

Next, power consumption in the gain adjustment unit will be described. Each of the gain adjustment units described in NPL 1 and 2 uses an active element such as an operational amplifier. Therefore, the gain adjustment units generate power consumption.

Embodiments of the present invention provide a variable gain amplifier which reduces power consumption at the power monitor unit and the gain adjustment unit to almost zero as described above. Embodiments of the present invention include a method that is particularly suitably applied to amplifiers with large output power such as a power amplifier.

Figure 1:
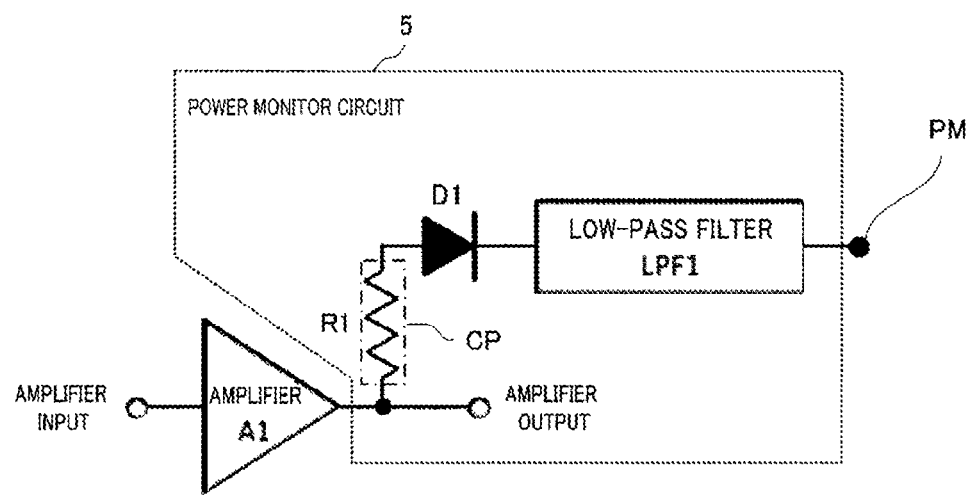
FIG. 1 is a diagram showing an outline of a power monitor circuit that is proposed as a power monitor unit in embodiments of the present invention.

First, a power monitor circuit (a power monitor unit) that is proposed as a power monitor unit in embodiments of the present invention will be described. FIG. 1 shows an outline of the power monitor circuit.

In a similar manner to the conventional power monitor circuit 4 (FIG. 15), a power monitor circuit 5 is also configured such that, by connecting one end of a coupler CP (in the present example, a high resistance R1) to an output line of an amplifier A1 and connecting another end of the coupler CP to an anode of a diode D1, a part of output of the amplifier A1 is taken out by the coupler CP and input to the diode D1. In addition, the power monitor circuit 5 is configured such that a low-pass filter LPF1 is connected to a cathode of the diode D1 and a DC component of a signal detected by the diode D1 is output to a monitor terminal PM.

The power monitor circuit 5 differs from the conventional power monitor circuit 4 in that the anode of the diode D1 is not biased to threshold voltage Vth but is unbiased (set to ground potential=0 volts). In other words, the power monitor circuit 5 is not provided by a bias circuit for the diode.

Figure 2:
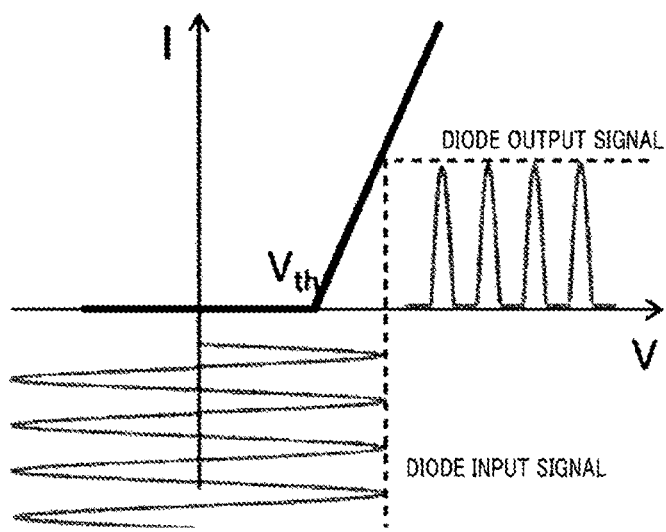
FIG. 2 is a diagram showing a diode input signal and a diode output signal in the power monitor circuit together with characteristics of a diode.

In this case, although weak signals cannot be detected since sharp detection characteristics near the threshold voltage Vth are unavailable, output power of a circuit such as a power amplifier with large output can be monitored. In other words, with a circuit with large output power, voltage generated at the anode of the diode D1 is large and, as shown in FIG. 2, the voltage of the anode of the diode D1 exceeds Vth. In this case, a portion with larger amplitude than Vth is to be detected in the diode D1 as shown in FIG. 2 and power can be monitored.

Figure 3:
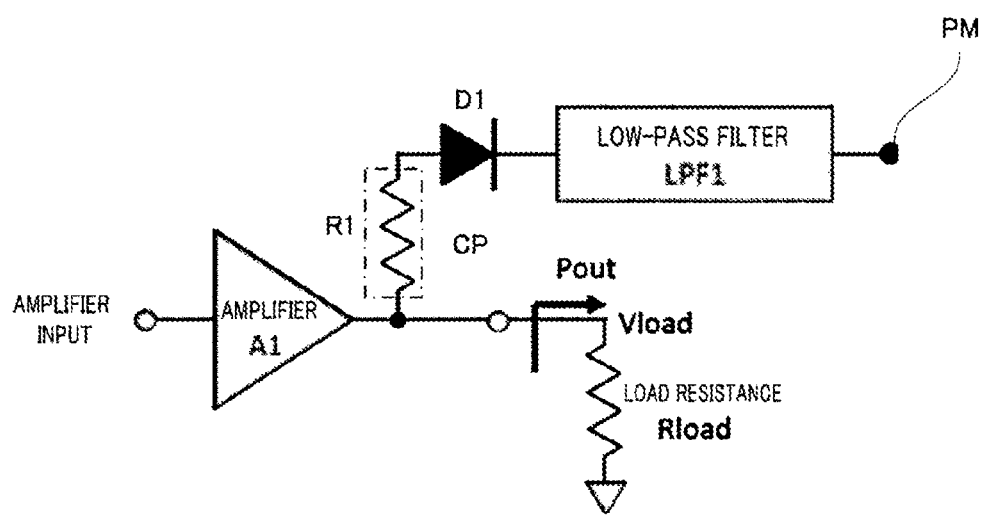
FIG. 3 is a diagram illustrating output power that can be monitored by the power monitor circuit.

Specific minimum output power that enables such monitoring to be performed can be calculated as follows. As shown in FIG. 3, let us assume that impedance (load resistance) of a load connected to output of the amplifier A1 is Rload. Let us also assume that output power of the amplifier A1 is Pout and voltage applied to the load is Vload. In this case, using Vload and Rload, Pout is represented by Formula (1) below.

Formula 1

$$P_{out} = \frac{V_{load}^2}{2R_{load}} \quad (1)$$

From Formula (1), Vload is represented by Formula (2) below.

Formula 2

$$V_{load} = \sqrt{2R_{load}P_{out}} \quad (2)$$

Once Vload in Formula (2) exceeds the threshold voltage Vth, the output power of the amplifier A1 can be monitored with the configuration shown in FIG. 1. Usually, in power amplifiers using coaxial system components, load resistance is 50 Ω. In addition, in cases of differential output, 100 Ω may be used as load resistance. While a waveguide is used in frequency bands exceeding 100 GHz, in such a case, the load resistance (equivalent to characteristic impedance of the waveguide) is 350 Ω.

Figure 4:
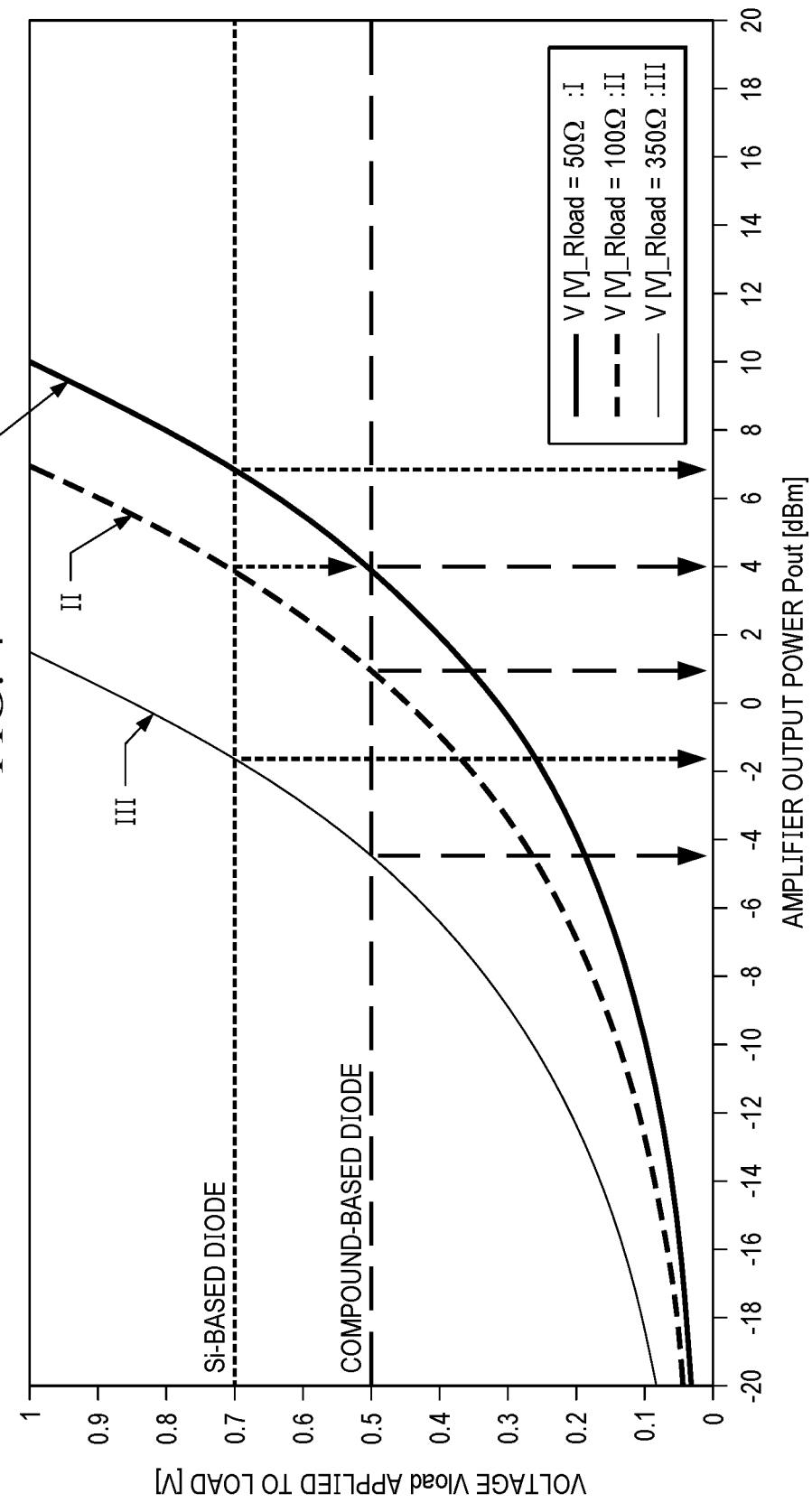
FIG. 4 is a diagram showing a calculation result of voltage Vload applied to a load when load resistance Rload is set to 50 Ω, 100 Ω, and 350 Ω.

FIG. 4 shows calculation results of Vload when using these load resistances. In FIG. 4, an abscissa represents Pout. FIG. 4 reveals that, when using a diode constituted by a Si-based device, embodiments of the present invention can be used with amplifier output power in a range where the value of Vload exceeds 0.7 V, and when using a compound-based diode (albeit an example since threshold voltage varies among different compound semiconductors), embodiments of the present invention can be used with amplifier output power at which the value of Vload exceeds 0.5 V.

For example, when the load resistance Rload is 50 Ω, the configuration shown in FIG. 1 can be realized using a Si-based diode with a power amplifier in which Pout exceeds 7 dBm. In addition, based on Formula 2 and FIG. 4, since Vload characteristically increases as Rload increases, embodiments of the present invention are particularly effective with respect to power amplifiers constituted by a waveguide-system component with a large load resistance value. In other words, embodiments of the present invention are useful in frequency bands equal to or exceeding 100 GHz in which a waveguide is used.

Figure 5:
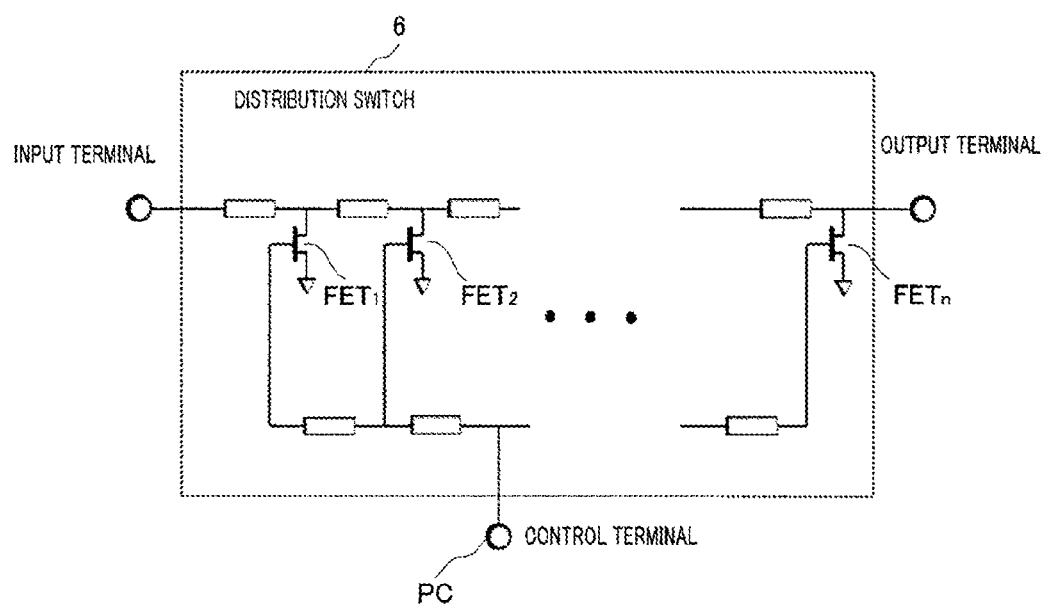
FIG. 5 is a diagram showing a distribution switch.

Next, a method of realizing a gain adjustment unit that does not generate power consumption will be described. A distribution switch (a switch made up of source-grounding FETs 1 to n) 6 as shown in FIG. 5 is predisposed to vary its pass characteristics depending on gate voltage of an FET. This is because the distribution switch 6 takes advantage of the fact that drain-source resistance of an FET varies depending on gate voltage.

By connecting the distribution switch 6 shown in FIG. 5 to an input unit of a power amplifier or between circuit stages of the power amplifier, gain of the amplifier can be made variable. In FIG. 5, since a current does not flow through the control terminal PC for adjusting voltage of a gate terminal, power consumption necessary for varying gain is not generated.

First Embodiment

As a first embodiment of the present invention, an example will be described in which the power monitor unit constituted by a power monitor circuit and the gain adjustment unit constituted by a distribution switch as described in [Principle of embodiments of the invention] above are applied to a 180 GHz-band amplifier.

Figure 6:
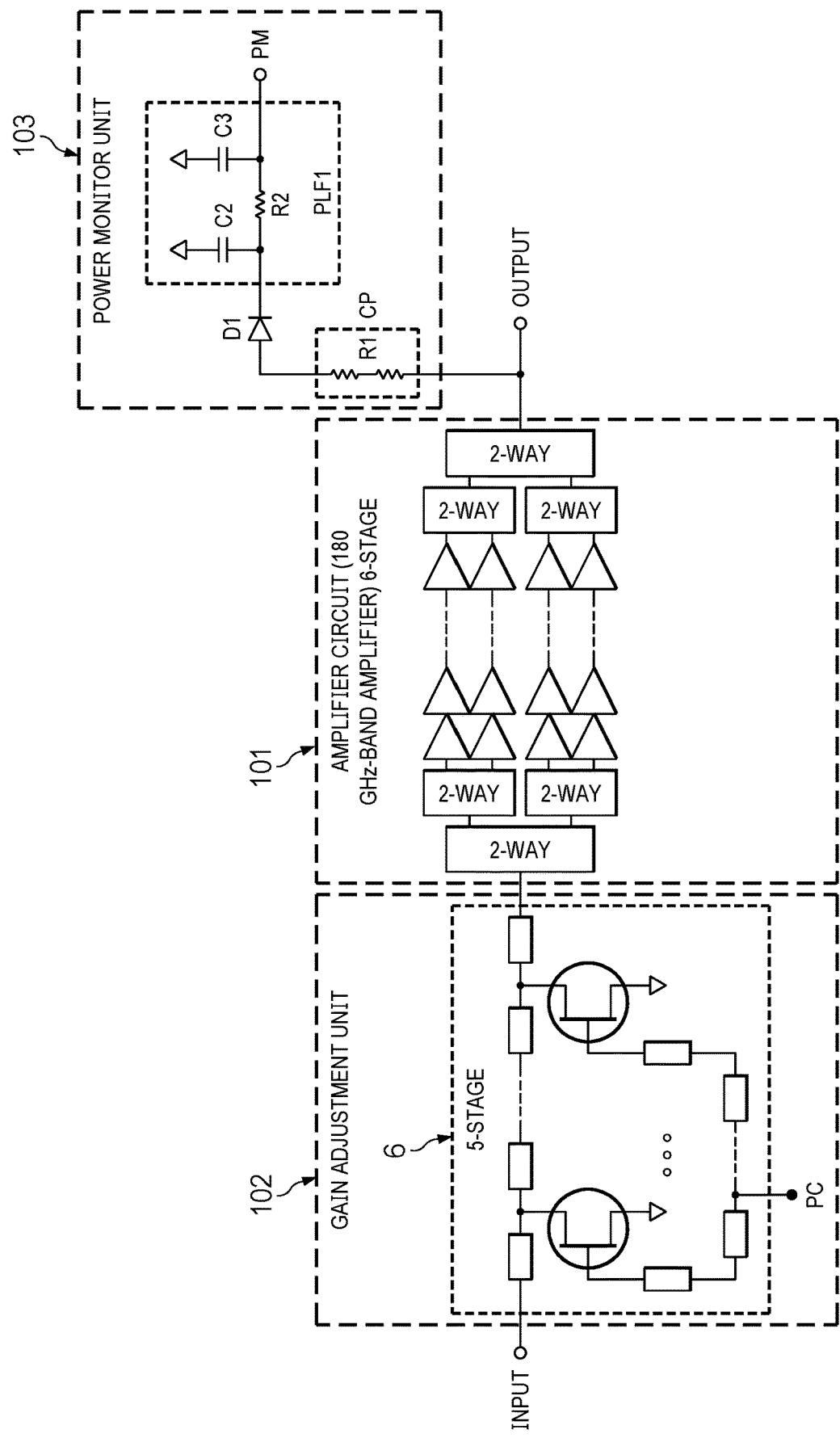
FIG. 6 is a diagram showing an overall configuration of a first embodiment of a variable gain amplifier according to embodiments of the present invention.
Figure 7:
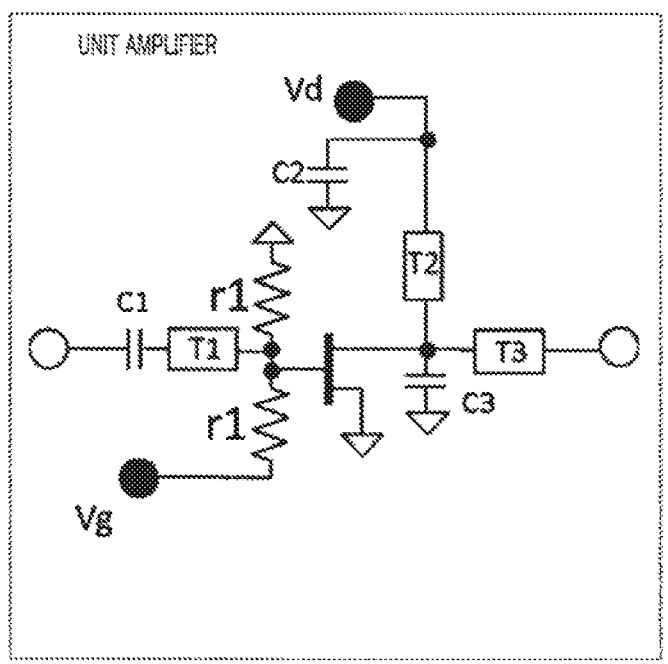
FIG. 7 is a diagram showing a configuration of a unit amplifier which constitutes an amplifier circuit in the variable gain amplifier.

FIG. 6 shows an outline of the example. FIG. 6 represents an overall configuration. A variable gain amplifier according to the present embodiment includes an amplifier circuit (a 180 GHz-band amplifier) 101, a gain adjustment unit 102, and a power monitor unit 103. FIG. 7 shows a unit configuration (a configuration of a unit amplifier) per one amplifier stage in the amplifier circuit 101.

As shown in FIG. 6, the amplifier circuit 101 is configured such that the unit amplifier shown in FIG. 7 is arranged in six serial stages and four parallel stages. In addition, in order to consolidate the amplifiers arranged in four parallel stages to one port in an input/output unit of the amplifier, a 4-way distribution/combination circuit constituted by two-branch circuits in 2 stages is arranged in the input/output unit.

An InP-HEMT with a gate width of 40 μm was adopted as the transistor used in the unit amplifier shown in FIG. 7. In addition, element values of resistors, capacitors, and transmission lines shown in FIG. 7 were as follows. The resistor r1 is 500 c, the capacitors C1, C2, and C3 are respectively 50 fF, 400 fF, and 42 fF, and the transmission lines T1, T2, and T3 all have characteristic impedance of 50 n and have electrical lengths at 180 GHz of, respectively, 10 degrees, 90 degrees, and 20 degrees.

In the power monitor unit 103 used in the overall configuration shown in FIG. 6, as the diode D1, an FET is used which equivalently acts as a diode by using a gate of an InP-HEMT with a gate width of 5 μm as an anode and short-circuiting a drain and a source to create a cathode. Vth of the present diode D1 is approximately 0.25 V. In addition, a value of R1 is set to 1000 Ω, a value of R2 is set to 500 Ω, a value of C2 is set to 450 fF, and a value of C3 is set to 2000 fF. Furthermore, as described in [Principle of embodiments of the invention], the anode of the diode D1 is unbiased. In other words, applied voltage to the anode of the diode D1 is set to o volts (ground potential), and the anode and the cathode of the diode D1 are set to a same potential.

Figure 8:
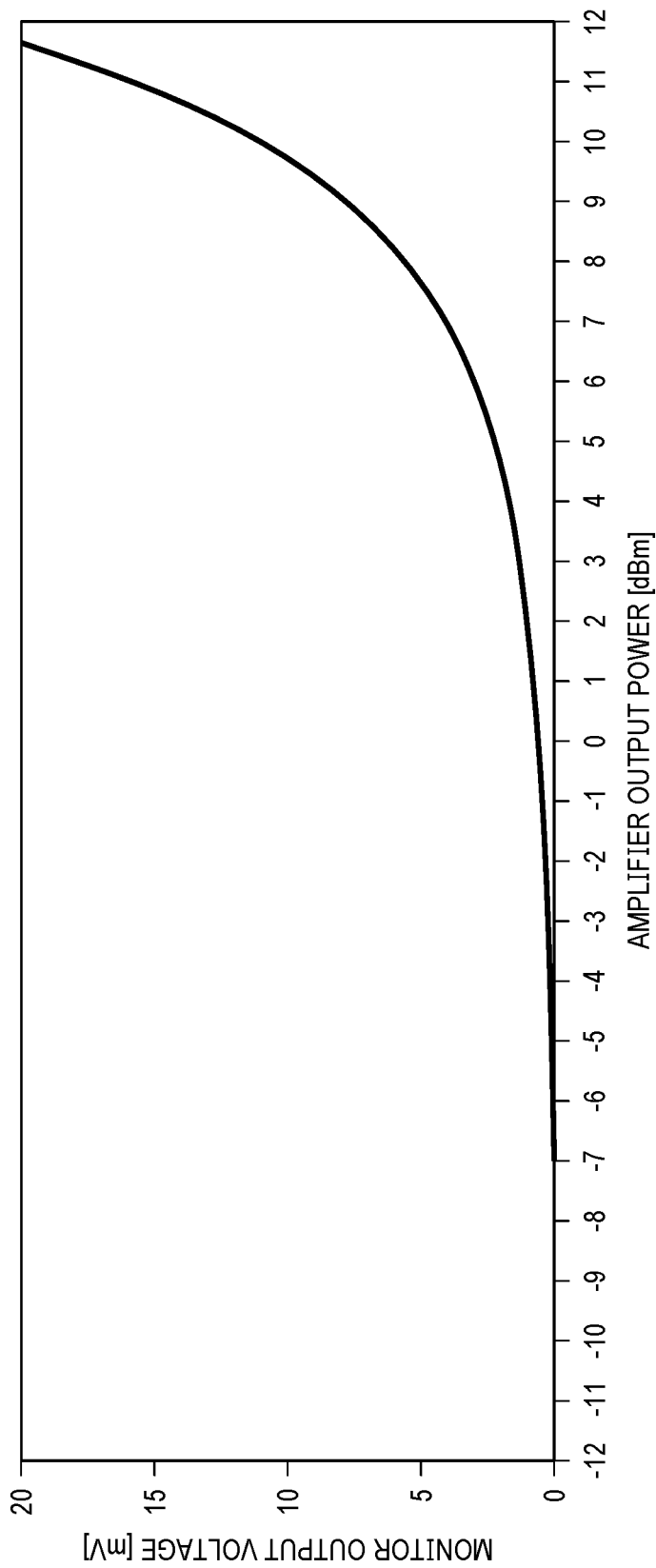
FIG. 8 is a diagram showing a calculation result of monitor output voltage relative to amplifier output power in the configuration shown in FIG. 6.

FIG. 8 shows a calculation result of voltage (monitor output voltage) which is generated at the monitor terminal PM in the configuration shown in FIG. 6. In the calculation, by setting the value of the load resistance to 50 Ω for both input and output, monitor output voltage is plotted when output power (amplifier output power) of the amplifier circuit 101 is varied from −7 dBm to 12 dBm which is maximum output power.

FIG. 8 reveals that monitor output voltage increases significantly as the amplifier output power increases from near 0 dBm and that the power monitor unit 103 is functioning as a monitor. It should be noted that FIG. 4 in [Principle of embodiments of the invention] shows that, in a case of a load of 50 Ω, the monitor output voltage starts to exceed 0.25 V which is Vth in this case when the amplifier output power is near −2 dBm, which more or less corresponds to the result shown in FIG. 8. This further corroborates effectiveness of the method proposed by embodiments of the present invention as described in [Principle of embodiments of the invention].

Figure 9:
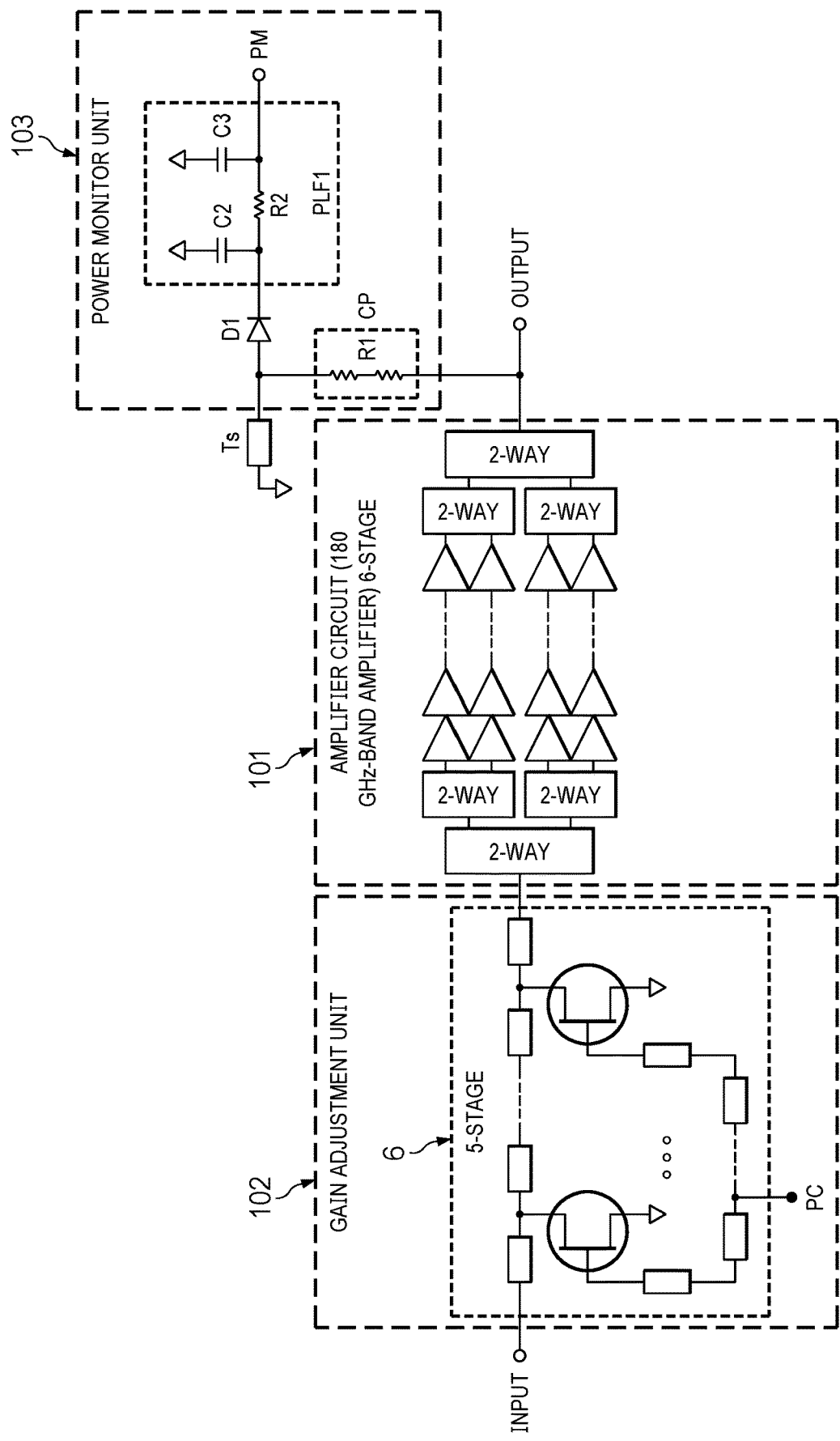
FIG. 9 is a diagram showing an example in which a transmission line is added as a short stub in order to improve sensitivity of the power monitor unit.

Next, a configuration shown in FIG. 9 will be described as a configuration for further improving sensitivity (a value of monitor output voltage relative to amplifier output power) of the power monitor unit 103. In FIG. 9, a transmission line of which one end is connected to ground potential is connected as a short stub Ts to the anode of the diode D1 shown in FIG. 6. Accordingly, the sensitivity of the power monitor unit 103 improves. A reason therefor is as follows. It should be noted that the short stub Ts may be an inductor. In the present specification, transmission lines and inductors will be collectively referred to as short stubs.

Figure 10:
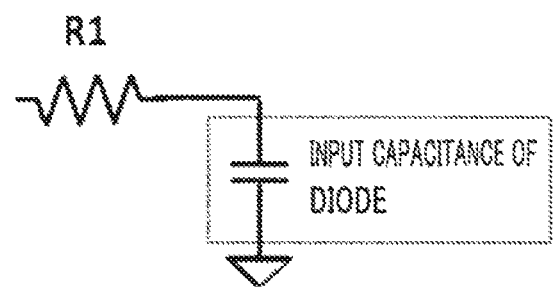
FIG. 10 is a diagram showing an equivalent circuit in a vicinity of an anode of a diode in the configuration shown in FIG. 6.

An equivalent circuit in a vicinity of the anode of the diode D1 in the configuration shown in FIG. 6 can be drawn as in FIG. 10. In this case, since an input capacitance is inevitably present in the diode D1 and the input capacitance lowers impedance of the anode of the diode D1, consequently, voltage that is generated at the anode of the diode D1 drops. Therefore, the sensitivity of the power monitor unit 103 is inevitably lower than that shown in FIG. 4 in [Principle of embodiments of the invention}.

In consideration thereof, an effective way to improve sensitivity is to cancel the input capacitance of the diode D1. As a method thereof, since adding the short stub Ts in parallel to the anode of the diode D1 as shown in FIG. 9 causes the short stubs Ts to act as inductances as shown in FIG. 11, the input capacitance of the diode D1 and the inductances of the short stubs Ts act as a parallel resonator and the input capacitance of the diode D1 can be canceled.

Figure 12:
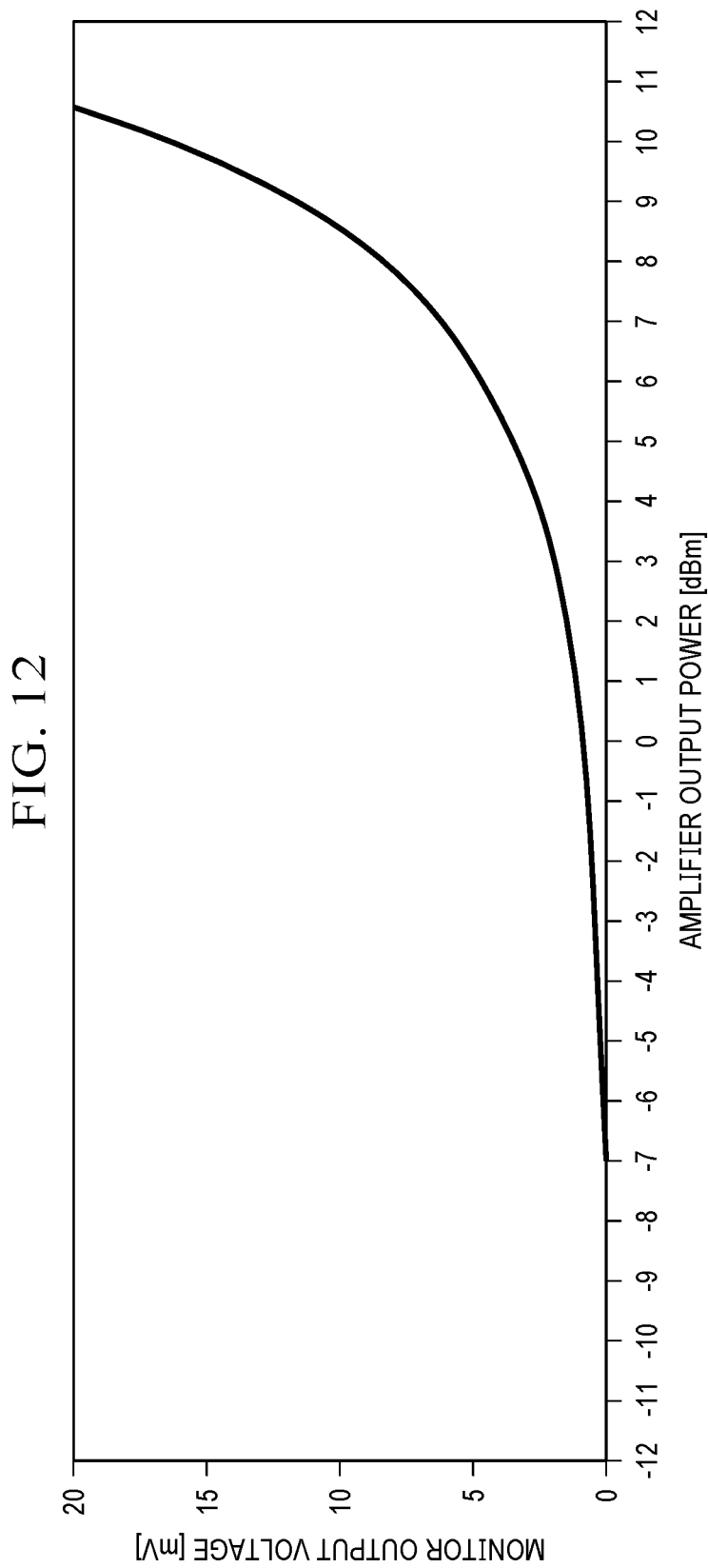
FIG. 12 is a diagram showing a calculation result of monitor output voltage relative to amplifier output power in the configuration shown in FIG. 9.

FIG. 12 shows a calculation result of monitor output voltage in the configuration shown in FIG. 9. The short stub Ts has a characteristic impedance of 50 Ω and an electrical length at 180 GHz of 20 degrees. It is revealed that the sensitivity of the power monitor unit 103 has improved as compared to FIG. 8. In addition, while FIG. 4 shows that, in a case of a load of 50 Ω, the monitor output voltage starts to exceed 0.25 V which is Vth in this case when the amplifier output power is near −2 dBm, FIG. 12 shows that the monitor output voltage actually starts to significantly rise from near −2 dBm, which reveals that characteristics close to a theoretical value are being produced. This is because the input capacitance of the diode D1 has been canceled by the short stub Ts.

Figure 11:
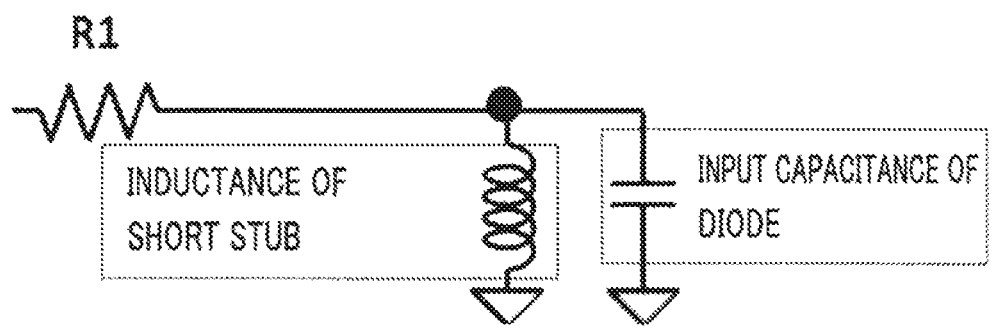
FIG. 11 is a diagram showing an equivalent circuit in a vicinity of an anode of a diode in the configuration shown in FIG. 9.

In this case, since a parallel resonance frequency fr in FIG. 11 is calculated as Formula 3

$$f_r = \frac{1}{2\pi\sqrt{LC}} \quad (3)$$

L which sets frequency of the amplifier to fr is uniquely determined, and when designing the circuit shown in FIG. 9, parameters of the short stub Ts may be determined so as to include such L.

In both of the configurations shown in FIGS. 6 and 9 described above, since the voltage applied to the anode of the diode D1 of the power monitor unit 103 is zero, power consumption at the power monitor unit 103 is approximately zero. As is apparent from FIGS. 8 and 12, while embodiments of the present invention are unsuitable for monitoring lower power unlike a conventional power monitor circuit (FIG. 15), embodiments of the present invention are suitable as a power monitor circuit of amplifiers of which output power exceeds 0 dBm such as an ordinary power amplifier.

Next, the gain adjustment unit 102 constituted by the distribution switch 6 arranged in the input unit of the amplifier circuit 101 in the configurations shown in FIGS. 6 and 9 will be described.

The distribution switch 6 is configured by serially connecting a basic switch in five stages, the basic switch being constituted by an InP-HEMT with a gate width of 10 μm and a transmission line with a characteristic impedance of 65 Ω and an electrical length at 180 GHz of 35 degrees.

Figure 13:
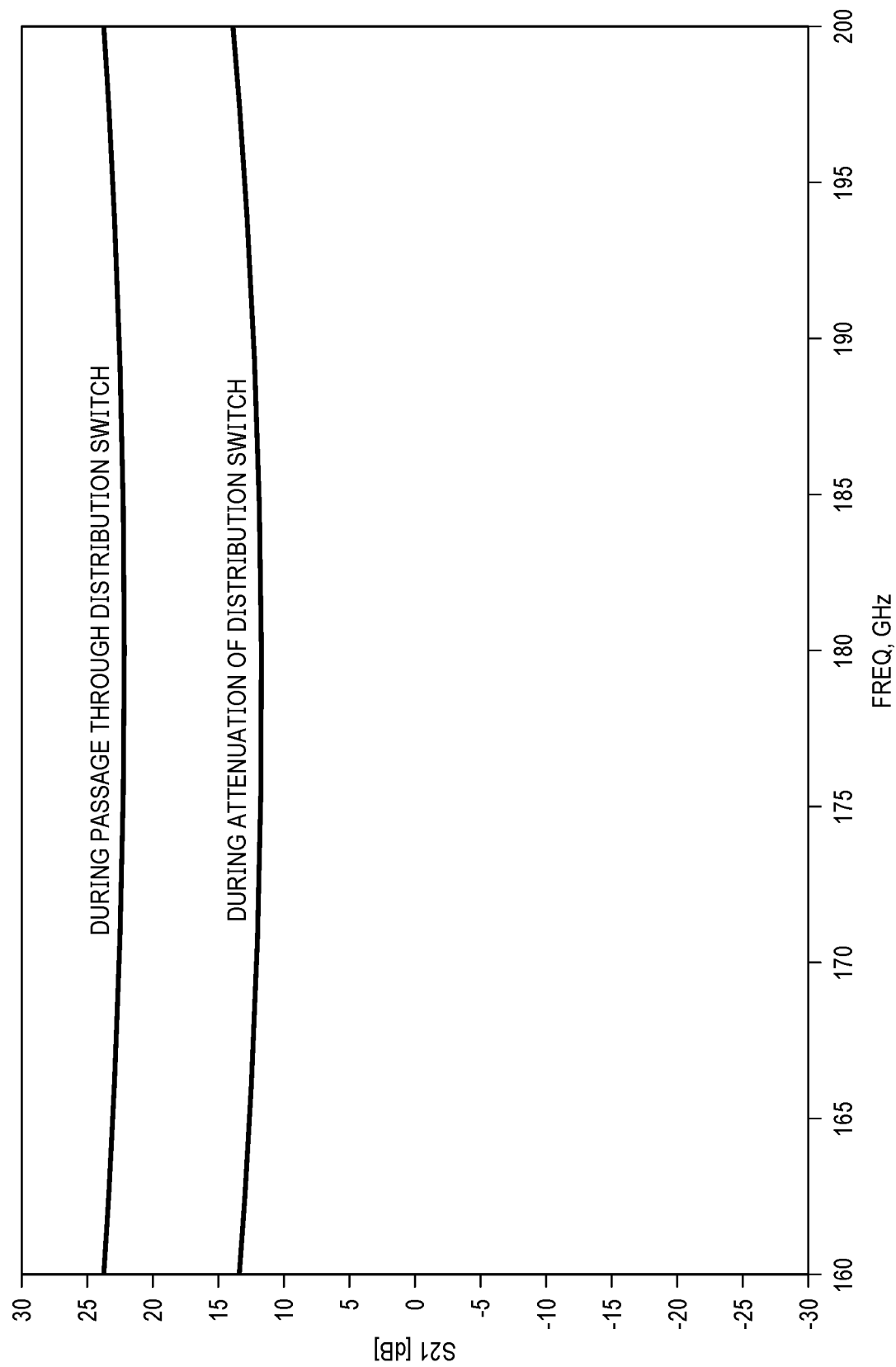
FIG. 13 is a diagram showing a calculation result when a gain of the amplifier circuit is changed from maximum gain to minimum gain by the distribution switch.
Figure 14:
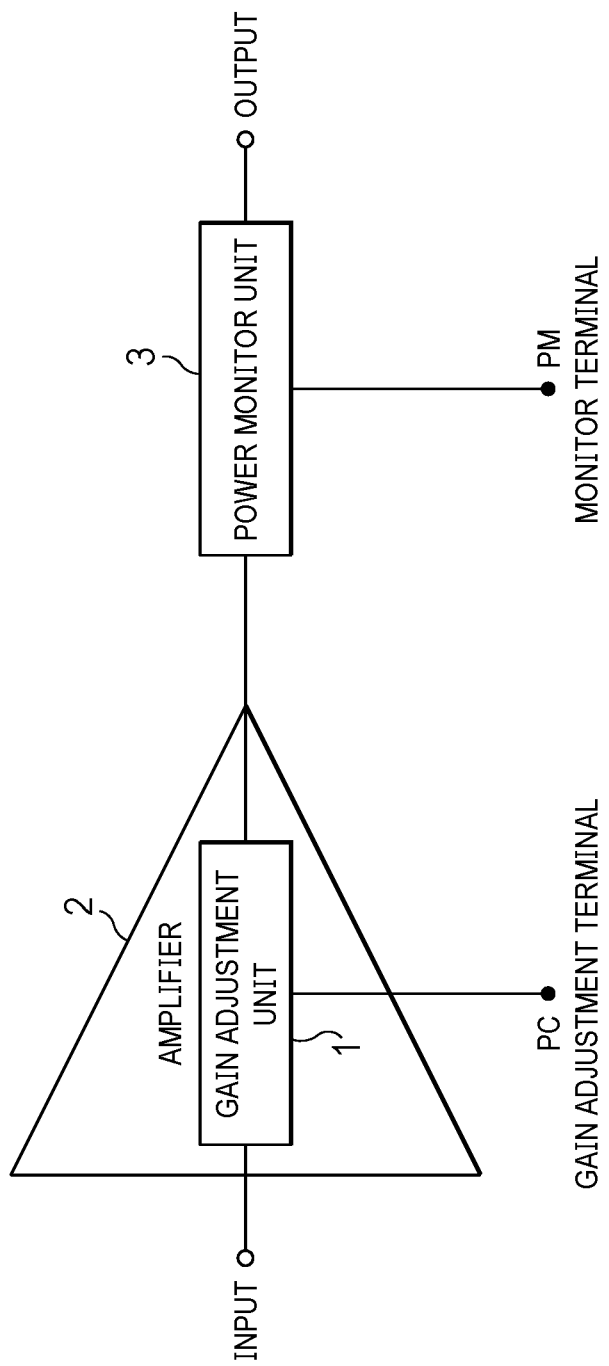
FIG. 14 is a diagram showing a basic configuration of a variable gain amplifier.

FIG. 13 is a diagram showing a calculation result when input to the control terminal PC of the distribution switch 6 is adjusted and the gain of the amplifier circuit 101 is changed from maximum gain to minimum gain. It is shown that the present switch realizes a gain adjustment of 10 dB. Since a current does not flow through the control terminal PC of the present switch, power consumption is almost zero.

As described above, in the present configuration, power consumption is almost zero in both the power monitor unit 103 and the gain adjustment unit 102 which are necessary for a variable gain amplifier. In other words, a system designer can allocate all power consumption to be originally allocated to these circuits to the power amplifier and, as described in [Principle of embodiments of the invention], a variable gain amplifier with higher output power than conventional variable gain amplifiers can be realized.

Second Embodiment

As a second embodiment, means for improving accuracy of the power monitor unit 103 will be described. In this case, accuracy refers to an amount of fluctuation of monitor output voltage when output power of an amplifier is a given value.

As shown in FIG. 2, since embodiments of the present invention uses sharp diode characteristics near the threshold voltage of a diode, when slight voltage is generated between an anode and a cathode, monitor output voltage varies.

In consideration thereof, in the second embodiment, a configuration will be described in which a grounded waveguide coupler is used as the coupler CP in order to set a potential of the anode of the diode D1 of the power monitor unit 103 of an output stage to a stable ground potential.

An example of a grounded coupler is a waveguide ridge coupler such as that described as a high frequency connection structure in PTL 1. A signal line of the present coupler is directly connected to a wall surface of the waveguide via a metal ridge. Accordingly, the anode potential of the diode D1 arranged in the output stage can be set to stable ground potential of the waveguide wall surface. As a result, the power monitor unit 103 can be realized in a stable and highly accurate manner.

Expansion of Embodiments

While embodiments of the present invention have been described with reference to embodiments, it is to be understood that the present invention is not limited to the embodiments described above. Various modifications to the configurations and details of the present invention will occur to and can be made by those skilled in the art within the technical scope of the present invention.

REFERENCE SIGNS LIST

5 Power monitor circuit
D1 Diode
CP Coupler
LPF1 Low-pass filter
A1 Amplifier
PM Monitor terminal
PC Control terminal
6 Distribution switch
101 Amplifier circuit (180 GHz-band amplifier)
102 Gain adjustment unit
103 Power monitor unit
Ts Short stub

The invention claimed is:

1. A variable gain amplifier, comprising:
a gain adjuster comprising a switch having a control terminal in an input of an amplifier circuit; and
a power monitor branched in an output of the amplifier circuit, wherein the power monitor comprises:
a coupler, a first end of the coupler being connected to an output line of the amplifier circuit;
a diode, an anode of the diode being connected to a second end of the coupler; and
a monitor terminal connected to a cathode of the diode via a low-pass filter, the anode of the diode being set to ground potential.

2. The variable gain amplifier according to claim 1, wherein the switch is a distribution switch.

3. The variable gain amplifier according to claim 1, wherein the coupler is a resistive element.

4. The variable gain amplifier according to claim 1, further comprising a transmission line or an inductor, wherein a first end of the transmission line or the inductor is connected to ground potential as a short stub, and wherein a second end of the transmission line or the inductor is connected to the anode of the diode.

5. The variable gain amplifier according to claim 4, wherein an impedance value of the short stub is set so as to configure a parallel resonance circuit with an input capacitance of the diode at an operating frequency.

6. The variable gain amplifier according to claim 1, wherein the coupler is a grounded waveguide coupler.

7. The variable gain amplifier according to claim 1, wherein a value of a voltage generated at the anode of the diode exceeds 0.7 V.

8. The variable gain amplifier according to claim 1, wherein a value of a voltage generated at the anode of the diode exceeds 0.5 V.

9. The variable gain amplifier according to claim 1, wherein a value of a voltage generated at the anode of the diode exceeds 0.25 V.

10. A method comprising:
connecting a power monitor in an output of an amplifier circuit;
wherein a gain adjuster comprises a switch having a control terminal in an input of the amplifier circuit; and
wherein the power monitor comprises:
a coupler, a first end of the coupler being connected to an output line of the amplifier circuit;
a diode, an anode of the diode being connected to a second end of the coupler; and
a monitor terminal connected to a cathode of the diode via a low-pass filter; and
wherein the method further comprises setting the anode of the diode to ground potential.

11. The method of claim 10, wherein the power monitor is branched in the output of the amplifier circuit.

12. The method of claim 10, wherein the switch is a distribution switch.

13. The method of claim 10, wherein the coupler is a resistive element.

14. The method of claim 10, wherein setting the anode of the diode to ground potential comprises:
connecting a first end of a transmission line or a inductor to ground potential as a short stub; and
connecting a second end of the transmission line or the inductor to the anode of the diode.

15. The method of claim 14, wherein an impedance value of the short stub is set so as to configure a parallel resonance circuit with an input capacitance of the diode at an operating frequency.

16. The method of claim 10, wherein the coupler is a grounded waveguide coupler.

17. The method of claim 10, wherein a value of a voltage generated at the anode of the diode exceeds 0.7 V.

18. The method of claim 10, wherein a value of a voltage generated at the anode of the diode exceeds 0.5 V.

19. The method of claim 10, wherein a value of a voltage generated at the anode of the diode exceeds 0.25 V.

* * * * *